(12) United States Patent  
Reis

(10) Patent No.: US 8,064,869 B2
(45) Date of Patent: Nov. 22, 2011

(54) ELECTRONIC MIXER

(75) Inventor: Ricardo dos Santos Reis, Turcifal (PT)

(73) Assignee: Synopsys, Inc., Mountain View, CA (US)

( * ) Notice: Subject to any disclaimer, the term of this patent is extended or adjusted under 35 U.S.C. 154(b) by 871 days.

(21) Appl. No.: 11/967,899

(22) Filed: Dec. 31, 2007

(65) Prior Publication Data

US 2009/0170465 A1   Jul. 2, 2009

(51) Int. Cl.
*H04B 1/26* (2006.01)
(52) U.S. Cl. ........ 455/318; 455/317; 455/310; 455/296; 455/313; 327/359; 327/355; 327/113
(58) Field of Classification Search .................. 455/318, 455/317, 310, 296, 313; 327/359, 355, 113
See application file for complete search history.

(56) References Cited

U.S. PATENT DOCUMENTS

| | | | |
|---|---|---|---|
| 6,292,047 B1 * | 9/2001 | Traylor | 327/359 |
| 6,335,651 B1 * | 1/2002 | Fayyaz | 327/359 |
| 6,535,725 B2 * | 3/2003 | Hatcher et al. | 455/317 |
| 7,554,381 B2 * | 6/2009 | Belot et al. | 327/359 |

* cited by examiner

*Primary Examiner* — Sanh Phu
(74) *Attorney, Agent, or Firm* — Bever, Hoffman & Harms, LLP; Jeanette S. Harms

(57) ABSTRACT

The present invention discloses a mixer comprising with an input stage (100) for receiving and amplifying input signals (VINP, VINN) and an output stage (300) for outputting output signals (Voutp, Voutn). A switching stage (200) is coupled between the input stage (100) and the output stage (300), the switching stage (200) mixing the amplified input signals with a local oscillator signal (vlop, vlon) to produce the output signals (Voutp, Voutn) at the output stage (300). An RC circuit (cop, rop; con, ron) is connected to the output stage (300) and adapted to move the pole of the output signals.

11 Claims, 3 Drawing Sheets

ELECTRONIC MIXER

TECHNICAL FIELD OF THE INVENTION

The invention relates to an electronic mixer.

BACKGROUND OF THE INVENTION

A frequency mixer is a nonlinear device that accepts at its input two or more signals and presents signals at its output that are a mixture of the frequencies of the input signals. The frequency mixer is often used to move signals between bands in telecommunications devices or audio devices.

SUMMARY OF THE INVENTION

The invention is an electronic mixer with an input stage for receiving and amplifying input signals and an output stage for outputting output signals. A switching stage is coupled between the input stage and the output stage. The switching stage mixes the amplified input signals with a local oscillator signal to produce the output signals at the output stage. An RC circuit is connected across a differential output of the output stage and adapted to move the pole of the output signals.

In one aspect of the invention, the input stage comprises a plurality of switchable transistors. The input stage may also have a plurality of gate resistors connected to gates of the plurality of switchable transistors. The gate resistors are switchably connected to either ground or a first bias signal.

In another aspect of the invention, the output stage of the mixer is coupled to a feedback stage which is adapted to produce a first bias signal for the input stage. The feedback stage comprises a comparator for comparing the current in the output stage with a fixed current and is adapted to produce the first bias signal on the basis of the comparison.

The invention also includes a method for mixing an input signal with a local oscillator frequency to produce an output signal. The input signal is amplified in an input stage which is biased by a bias signal. The amplified input signal is combined with the local oscillator frequency to produce an output signal at a different frequency. The output signal is outputted at an output stage. The current in the output stage is detected and the bias signal of the input stage adjusted by comparing the current in the output stage with a reference value so as to stabilize the current in the output stage.

DETAILED DESCRIPTION OF THE PREFERRED EMBODIMENTS OF THE INVENTION

Figure 1A:
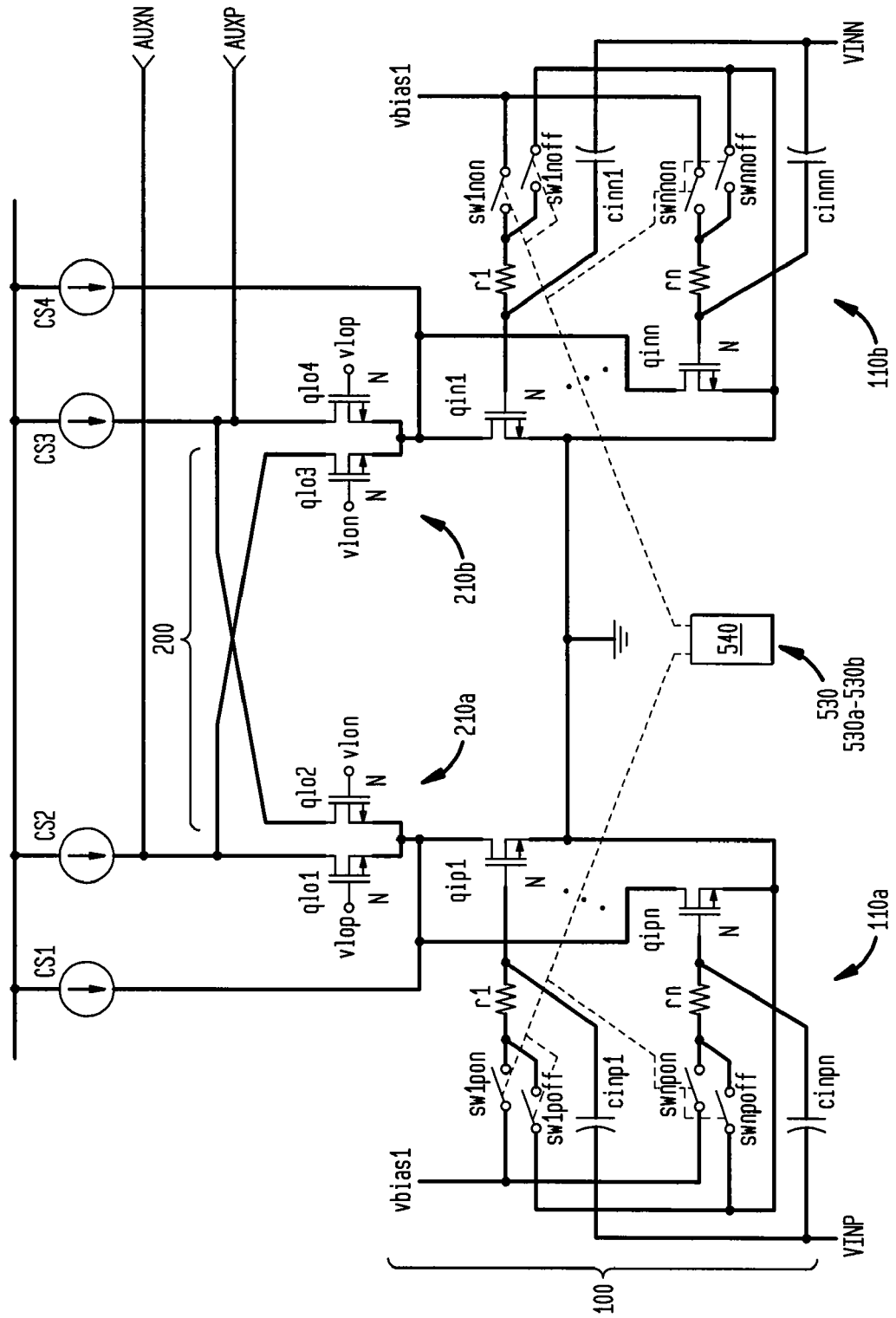
FIGS. 1A and 1B illustrate a block diagram of a mixer according to the invention.
Figure 1B:
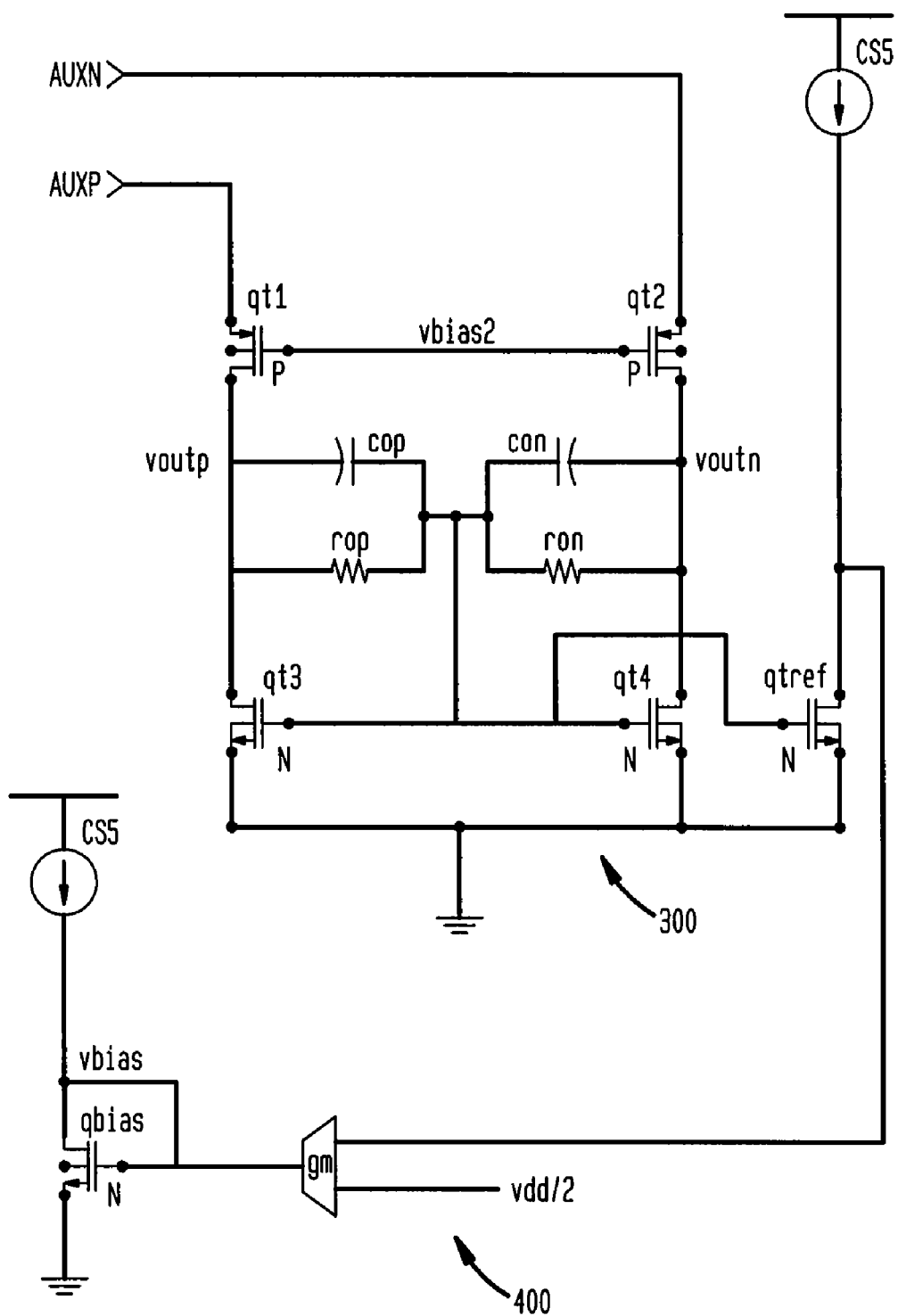

FIGS. 1A and 1B show an example of a mixer according to the current invention. The mixer comprises an input stage 100, a Gilbert cell 200, an output stage 300 and a feedback stage 400.

The input stage 100 comprises two halves 110a and 110b which accept a differential input signal VINP and VINN. The two halves 110a and 110b are substantially identical and thus only a first half 110a of the two halves will be described in detail. The first half 110a has a plurality of n switchable transistors qip1 to qipn. Only the transistors qip1 and qipn are shown in FIG. 1 for simplicity. The dotted line indicates the position of each of the other n switchable transistors qip2 to qipn−1. The input VINP to the first half 110a is connected to the gates of the n switchable transistors qip1 to qipn through a corresponding plurality of n isolation capacitors cinp1 to cinpn. Each one of the plurality of n isolation capacitors cinp1 to cinpn is connected to a gate of one of the plurality of n switchable transistors qip1 to qipn.

In one application of the invention, the mixer is used to down convert television signals from one of the television bands, e.g. VHF (180 MHz to 270 MHz), UHF (480 MHz to 870 MHz), or Lband (1450 MHz to 1660 MHz). The maximum bandwidth is 8 MHz and ideally the spectrum is reasonably flat. The output signal is centered at zero with +/−4 MHz band edges. Two of the mixers can be used in parallel to produce the I and Q components of the television signal.

The gates of the plurality of n switchable transistors qip1 to qipn are connected either to a first bias voltage vbias1 or to ground though resistor r1 to rn. A plurality of 2n switches sw1*p*on to swnpon and sw1*p*off to swnpoff switch the gates of the plurality of n switches to either the first bias voltage vbias1 or to ground. The switches sw1*p*on to swnpon and sw1*p*off to swnpoff are connected to a logic block 540 which is in turn connected to a calibration signal 530. The logic block 540 supplies a bias signal to the ones of the plurality of n switchable transistors qip1 to qipn which need to be switched on to adjust the fine gain of the mixer.

A constant current source CS1 provides a constant current to the channels of the plurality of n switchable transistors qip1 to qipn.

The input stage 100 serves to control the gain of the mixer. By use of a suitable choice of resistors r1 to rn the coarse gain of the mixer can be adjusted. The plurality of n switchable transistor qip1 to qipn allow a fine adjustment of the gain of the mixer since the plurality of n switchable transistors qip1 to qipn can be switched into and out of the input stage 100 through switches which are not shown on this Fig. This allows the fine gain of the mixer to be adjusted as the gain of the mixer can vary due to process variations.

Figure 2:
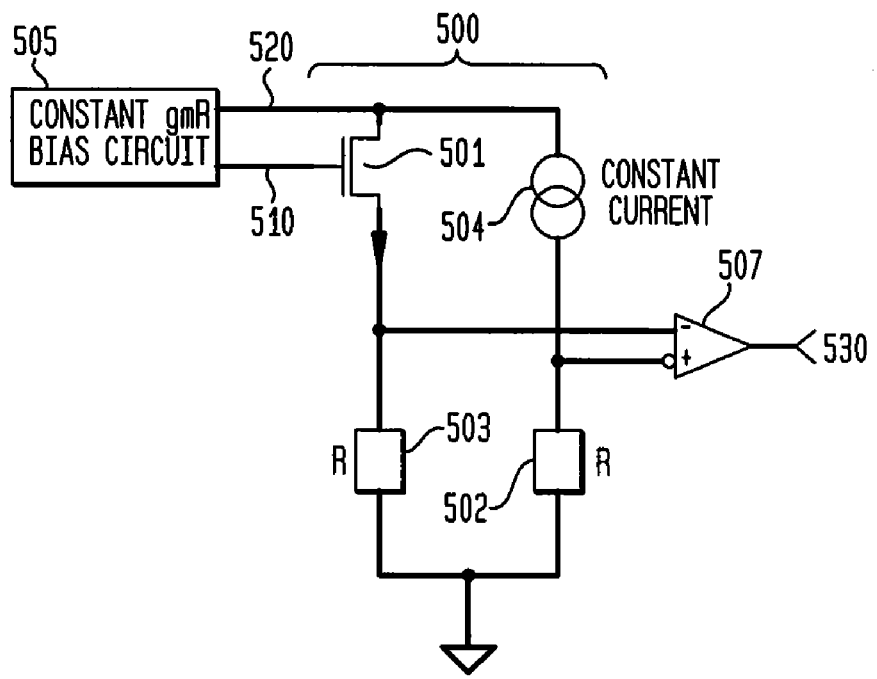
FIG. 2 illustrates a calibration circuit according to the invention.

One example of a calibration circuit 500 which can be used to adjust the fine gain of the mixer is shown in FIG. 2. The calibration circuit 500 comprises a constant gmR bias circuit 505 with a supply line 520 set at Vdd and an output 510 which biases the gate of a test transistor 501. The test transistor 501 is matched with a transistor within the constant gmR bias circuit 505. The supply line 520 is connected to the drain of the test transistor 501 and also to a constant current source 504. The output 520 biases the gate of the test transistor 501 such that the current passing though the channel is proportional to the current generated by the constant gmR bias circuit 500. A first calibration resistor 502 is connected between ground and the other side of the constant current source 504. A second calibration resistor 503 is connected between the source of the test transistor 501 and ground. The value of the first resistor 502 and the second resistor 503 are substantially the same. Since both of the first calibration resistor 502 and the second calibration resistor 503 are placed substantially close to each other on the chip surface, any difference in process parameters between the first calibration resistor 502 and the second calibration resistor 503 are substantially eliminated.

The difference in potential across the first calibration resistor 502 and the second calibration resistor 503 is measured in a differential amplifier 505 which produces an output as the calibration signal 530 which is dependent on the difference in the potentials across the first calibration resistor 502 and the second calibration resistor 502. Since the constant current source 504 produces a constant current and thus the potential across the first calibration resistor 502 is uniform, the output 530 of the differential amplifier 505 is dependent on processing variations in the test transistor 501. The output 530 can be used to switch the plurality of n switchable transistor qip1 to qipn using the logic block 540 shown in FIG. 1

Figure 3:
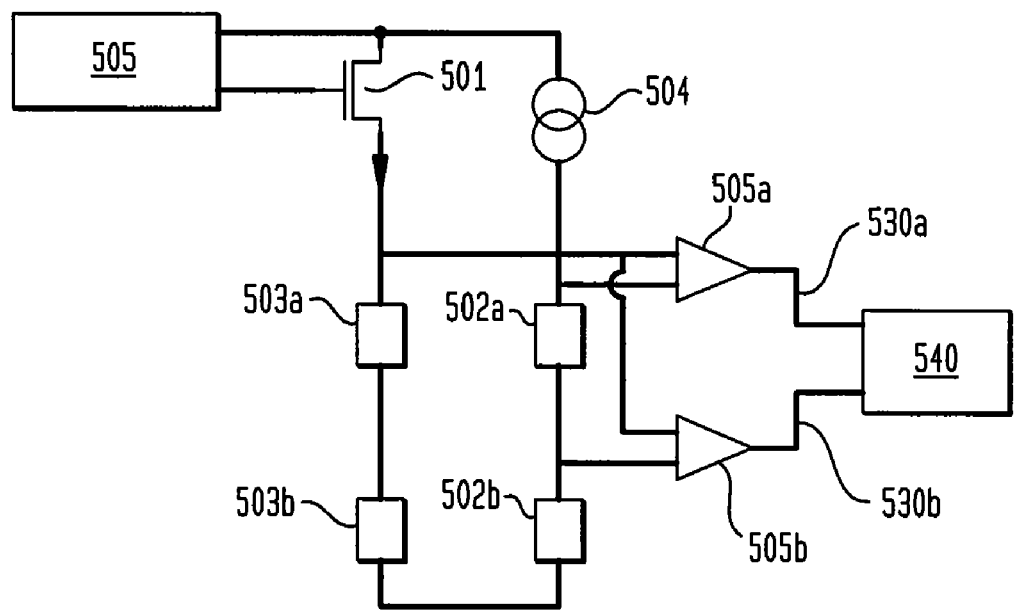
FIG. 3 illustrates another aspect of the calibration circuit according to the invention.

In a further aspect of the invention shown in FIG. 3, the first calibration resistor 502 is replaced by a first bank of calibrations resistors 502a-502b connected in series. The second calibration resistor 503 is replaced by a first bank of calibration resistors 502a-503b connected in series. For simplicity, only two resistors are shown in the first bank of calibration resistors and the second bank of calibration resistors. It will be recognized, however, that a number of resistors can be used. A plurality of differential amplifiers 505a-505b taps the first bank of resistors 502a-502b and the second bank of resistors 503a-503b at appropriate points and produces a plurality of outputs 530a-530b. The plurality of outputs 530a-530b are used to switch the plurality of n switchable transistors qip1 to qipn and qin1 to qinn through the logic block 540.

The Gilbert cell 200 is also arranged in two halves 210a and 210b. Again for the purposes of simplicity, only a first half 210a of the Gilbert cell 200 will be described. The principle of the Gilbert cell is known in the art and it produces as an output current a multiplication of the differential base currents of both of the inputs VINP and VINN.

The first half 210a of the Gilbert cell has two matched transistors qlo1 and qlo2. A bias signal Vlop with a local oscillator frequency is applied to the gate and the source of a first one qlo1 of the two matched transistors. The local oscillator frequency used is determined by the application of the mixer. For example, use of the mixer in TV applications would mean that the local oscillator signal is centered on the TV band for the input signals. a bias signal vlon with a local oscillator frequency is applied to the gate and the source of a second one qlo2 of the two matched transistors. The drain of the first one qlo1 of the two matched transistors is connected to a second current source cs2 and the drain of the second one qlo2 of the two matched transistors is connected to a third current source cs3.

The drains of both the first one qlo1 and the second one qlo2 of the two matched transistors are connected to the output stage 300 through a first cascode transistor qt1 and a second cascode transistor qt2. The first cascode transistor qt1 and the second cascode transistor qt2 serve to isolate the Gilbert cell 200 from the output stage 300.

One of the differential inputs to the output stage 300 is connected to the source of the first cascode transistor qt1 (p-type) and the other one of the differential input to the output stage is connected to the source of the second cascode transistor qt2 (p-type). The gates of the first cascode transistor qt1 and the second cascode transistor qt2 are connected to a second bias voltage Vbias2.

The differential output signals voutp and voutn of the output stage 300 are at the drains of the first cascode transistor qt1 and the second cascode transistor qt2.

The differential output signal voutp is also connected to an RC circuit formed from a capacitor cop and a resistor rop, Similar the different output voutn is connected to an RC circuit formed from a capacitor con and a resistor ron. The two RC circuits are used to control the pole of the differential output signal and to ensure that the first pole of a subsequent filter stage appears at the output stage of the mixer. This has the advantage that it reduces the linearity requirements for both the mixer and the subsequent filtering stages The differential output signals voutp and voutn are also connected to a common mode feedback circuit formed from a first feedback transistor qt3 and a second feedback transistor qt4. The gates of the first feedback transistor qt3 and the second feedback transistor qt4 are connected to a reference transistor qtref whose channel is connected to a constant current source CS5. The drain of the reference transistor qtref is connected to the feedback circuit 400 and thence to a constant gm comparator 410 where the voltage is compared to half the supply voltage vdd/2. The output of the constant gm comparator 410 is passed to a biasing transistor qbias which is in series with a sixth constant current source CS6. The first biasing voltage vbias1 is tapped from the drain of the biasing transistor qbias and used in the input stage 100 as disclosed above.

In operation, the reference transistor qtref takes the sum of the current flowing through the first feedback transistor qt3 and the second feedback transistor qt5 and compares this combined current with the current from the current source CS5. If the combined current is too small, the value of the biasing voltage Vbias1 is increased so that the current is increased at the input stage 100.

The plurality of n switchable transistors qip1 to qipn in the input stage are very small in dimensions and thus highly susceptible to process variations. Thus the current in the output stage can be very dependent on the process parameters used in the manufacture of the circuit. The use of the current in the output stage 300 to control the first biasing voltage Vbias1 in the input stage 100 reduces the effect of process variations on performance of the circuit.

While various embodiments of the present invention have been described above, it should be understood that they have been presented by way of example, and not limitation. It will be apparent to persons skilled in the relevant arts that various changes in form and detail can be made therein without departing from the scope of the invention. For example, in addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code and/or instructions disposed in any form, such as source, object or machine language) disposed, for example, in a computer usable (e.g., readable) medium configured to store the software. Such software can enable, for example, the function, fabrication, modeling, simulation, description and/or testing of the apparatus and methods described herein. For example, this can be accomplished through the use of general programming languages (e.g., C, C++), hardware description languages (HDL) including Verilog HDL, VHDL, SystemC Register Transfer Level (RTL), and so on, or other available programs. Such software can be disposed in any known computer usable medium such as semiconductor, magnetic disk, optical disk (e.g., CD-ROM, DVD-ROM, etc.). Embodiments of the present invention may include methods of providing an apparatus described herein by providing software describing the apparatus and subsequently transmitting the software as a computer data signal over a communication network including the Internet and intranets.

CONCLUSION

It is understood that the apparatus and method embodiments described herein may be included in a semiconductor intellectual property core, (e.g., embodied in HDL) and transformed to hardware in the production of integrated circuits. Additionally, the apparatus and method embodiments described herein may be embodied as a combination of hardware and software. Thus, the present invention should not be limited by any of the above-described exemplary embodiments, but should be defined only in accordance with the following claims and their equivalence. Furthermore, it should be appreciated that the detailed description of the present invention provided herein, and not the summary and abstract sections, is intended to be used to interpret the claims. The summary and abstract sections may set forth one or more but not all exemplary embodiments of the present invention.

What is claimed:

1. A mixer comprising:
    an input stage for receiving and amplifying input signals;
    an output stage for outputting output signals
    a switching stage coupled between the input stage and the output stage, the switching stage mixing the amplified input signals with a local oscillator signal to produce the output signals at the output stage;
    an RC circuit connected across a differential output of the output stage and adapted to move a pole of the output signals,
    wherein the input stage comprises a plurality of gate resistors connected to gates of a plurality of switchable transistors, the plurality of gate resistors being switchably connected to either a low source voltage or a first bias signal.

2. The mixer of claim 1, wherein the RC circuit comprises at least one capacitor arranged in parallel with at least one resistor across the differential output of the output stage.

3. The mixer of claim 1, wherein the input stage comprises a plurality of switchable transistors.

4. The mixer of claim 1, wherein the output stage is coupled to a feedback stage, the feedback stage being adapted to produce the first bias signal for the input stage.

5. The mixer of claim 4, wherein the feedback stage comprises a comparator for comparing a current in the output stage with a fixed current and adapted to produce the first bias signal based on the comparing.

6. The mixer of claim 1,
    wherein the switching stage comprises a first differential transistor pair having first electrodes coupled at a first common connection and a second differential transistor pair having second electrodes coupled at a second common connection, the first common connection being coupled to a first electrode of the input stage and the second common connection being coupled to a second electrode of the input stage.

7. The mixer of claim 6, wherein the first differential transistor pair has third electrodes and the second differential transistor pair has fourth electrodes and wherein one of the third electrodes of the first differential transistor pair is coupled to one of the fourth electrodes of the second differential transistor pair and wherein an other one of the third electrodes of the first differential transistor pair is coupled to an other one of the fourth electrodes of the second differential transistor pair.

8. A method for mixing an input signal with a local oscillator frequency to produce an output signal, the method comprising:
    amplifying the input signal in an input stage, wherein the input stage is biased by a bias signal
    combining the amplified input signal with the local oscillator frequency to produce an output signal at a different frequency;
    outputting the output signal at an output stage;
    detecting a current in the output stage;
    adjusting the bias signal of the input stage by comparing the current in the output stage with a reference value so as to stabilize the current in the output stage; and
    adjusting fine gain by selecting ones of a bank of switchable transistors in the input stage using the bias signal.

9. The method of claim 8, wherein the selecting is dependent on a difference between a current passing through a test transistor and a reference current.

10. A computer program product embodied on a computer-readable medium and comprising executable instructions for the manufacture of a mixer comprising:
    an input stage for receiving and amplifying input signals;
    an output stage for outputting output signals;
    a switching stage coupled between the input stage and the output stage, the switching stage mixing the amplified input signals with a local oscillator signal to produce the output signals at the output stage; and
    an RC circuit connected to the output stage and adapted to move a pole of the output signals,
    wherein the input stage comprises a plurality of gate resistors connected to gates of a plurality of switchable transistors, the plurality of gate resistors being switchably connected to either a low source voltage or a first bias signal.

11. The computer program product of claim 10, wherein the executable instructions are programmed in a hardware description language selected from a group consisting of Verilog, VHDL, and RTL.

* * * * *

UNITED STATES PATENT AND TRADEMARK OFFICE
CERTIFICATE OF CORRECTION

| | | |
|---|---|---|
| PATENT NO. | : 8,064,869 B2 | Page 1 of 1 |
| APPLICATION NO. | : 11/967899 | |
| DATED | : November 22, 2011 | |
| INVENTOR(S) | : Ricardo Dos Santos Reis | |

It is certified that error appears in the above-identified patent and that said Letters Patent is hereby corrected as shown below:

On the Title Page

Item (57) ABSTRACT
1st line, delete "with".

In the Claims

Column 5
Line 32, amend "a" to --the--.

Column 6
Line 14, insert a --;-- after "signal".

Signed and Sealed this
Twenty-fourth Day of September, 2013

Teresa Stanek Rea
*Deputy Director of the United States Patent and Trademark Office*